United States Patent [19]

Savage, Jr.

[11] Patent Number: 5,116,229
[45] Date of Patent: May 26, 1992

[54] LIGHT UNIT TERMINALS MAINTAINED IN BENT CONDITION

[76] Inventor: John M. Savage, Jr., 538 B Via de la Valle, Solana Beach, Calif. 92075

[21] Appl. No.: 628,853

[22] Filed: Dec. 17, 1990

[51] Int. Cl.⁵ ............................................. H05K 1/00
[52] U.S. Cl. ...................................... 439/56; 439/595; 439/83; 361/417
[58] Field of Search ............... 439/55, 56, 80–83, 439/717, 552, 554, 547, 558, 595; 362/226, 396, 800, 368; 361/400, 417–420

[56] References Cited

U.S. PATENT DOCUMENTS

| | | |
|---|---|---|
| 3,887,803 | 6/1975 | Savage, Jr. . |
| 4,035,681 | 6/1977 | Savage, Jr. . |
| 4,065,198 | 12/1977 | Jordan ................... 439/56 |
| 4,195,330 | 3/1980 | Savage, Jr. . |
| 4,398,240 | 8/1983 | Savage, Jr. . |
| 4,402,110 | 9/1983 | Savage, Jr. . |
| 4,471,414 | 9/1984 | Savage, Jr. . |
| 4,491,900 | 1/1985 | Savage, Jr. . |
| 4,583,807 | 4/1986 | Kaufman et al. ............... 439/83 |
| 4,674,008 | 6/1987 | Oyama et al. ................... 439/56 |
| 4,676,565 | 6/1987 | Reichardt ...................... 439/83 |
| 4,727,648 | 3/1988 | Savage, Jr. . |
| 4,790,763 | 12/1988 | Weber et al. ................... 439/717 |
| 4,837,927 | 6/1989 | Savage, Jr. . |
| 4,897,769 | 1/1990 | Lang ............................. 362/226 |

Primary Examiner—David L. Pirlot
Attorney, Agent, or Firm—William W. Haefliger

[57] ABSTRACT

An assembly including a circuit element having a base, and terminals projecting rearwardly from the base, the combination with the element comprising a body defining a forwardly opening recess receiving the base of the element for retention in the recess; the body having a laterally extending rear wall defining through openings for passing the rearwardly projecting terminals; and terminal retention flanges integral with the body and extending rearwardly of the rear wall for retaining the terminals in pre-determined bent conditions, rearwardly of the rear wall.

17 Claims, 5 Drawing Sheets

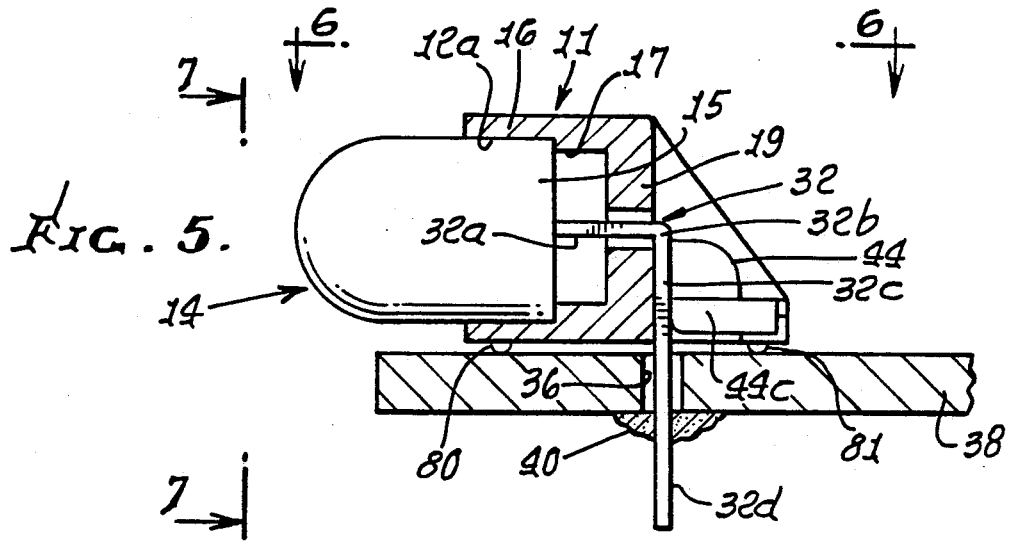
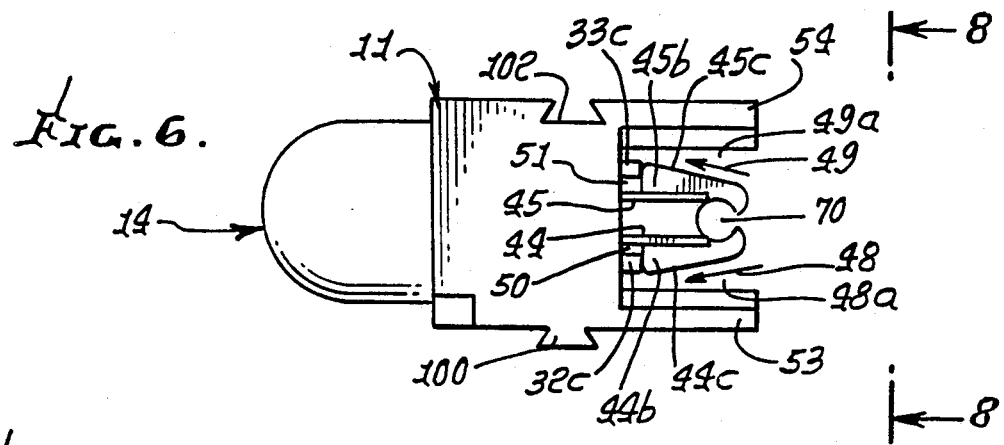
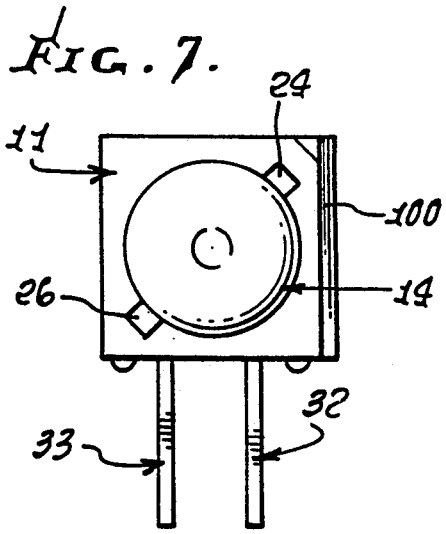
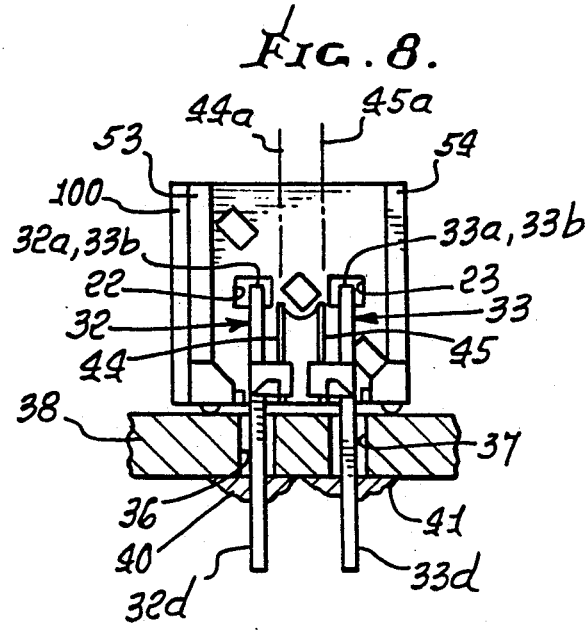

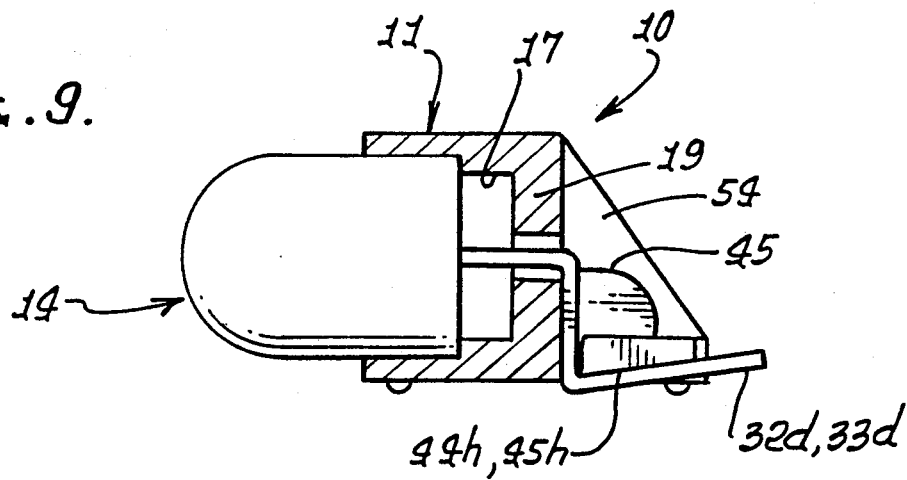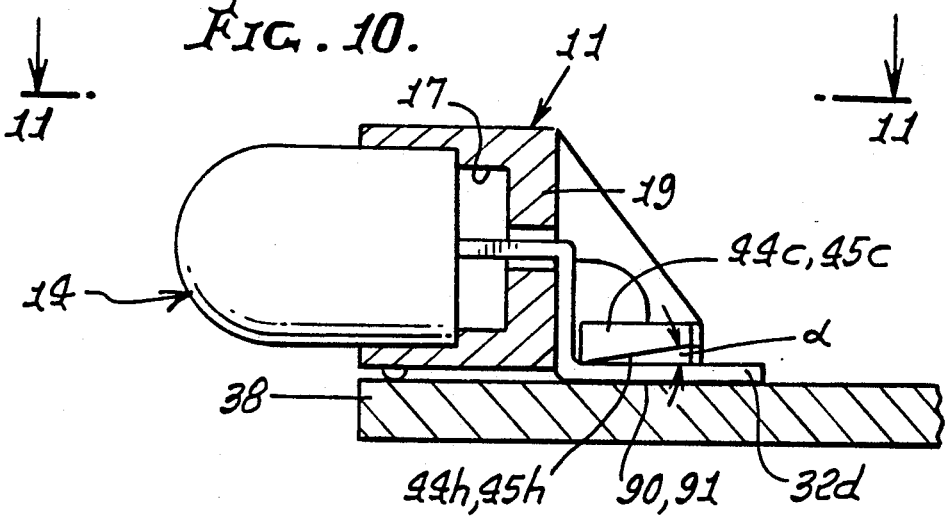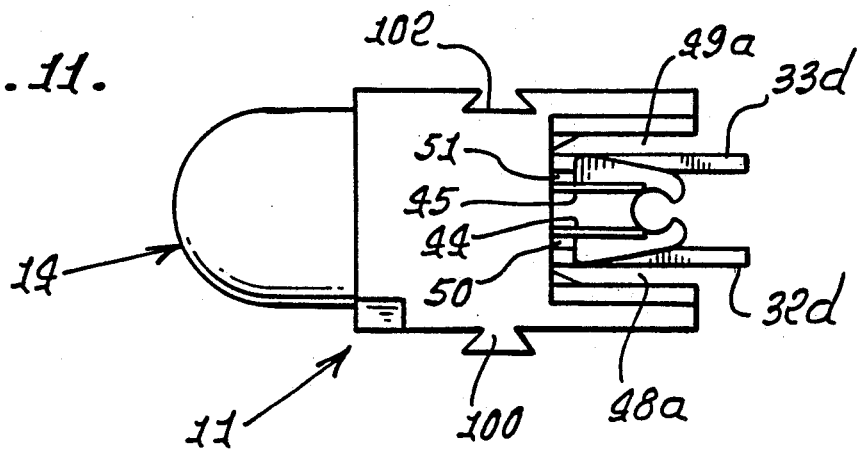

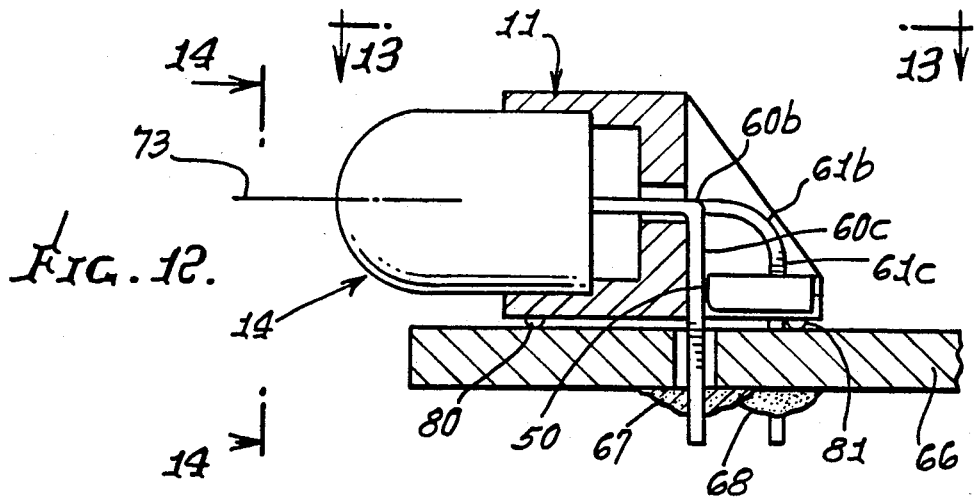
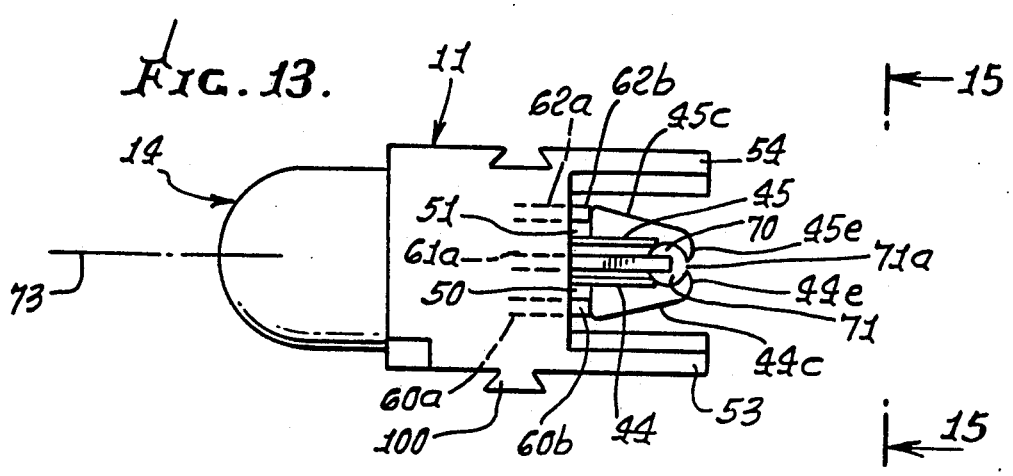
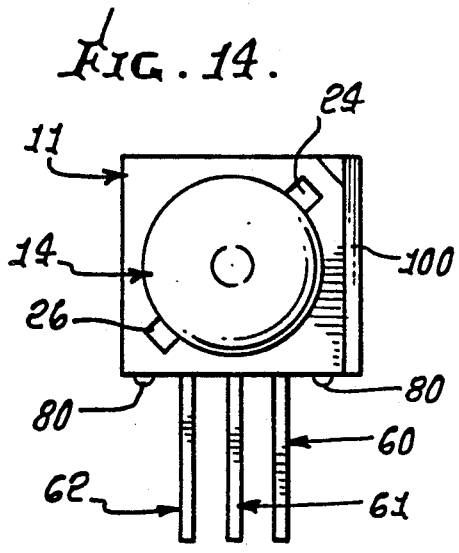
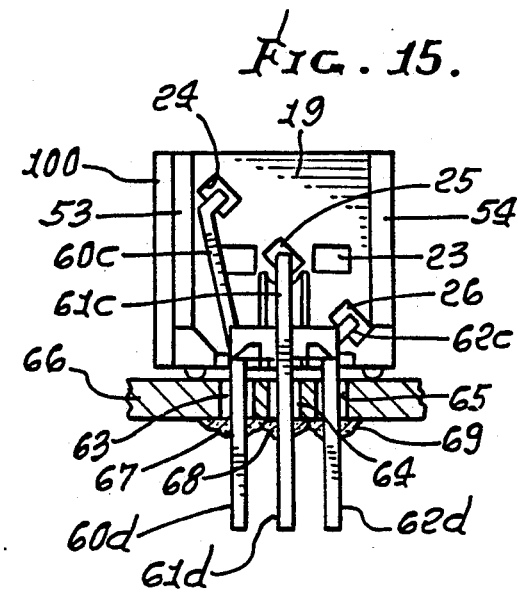

LIGHT UNIT TERMINALS MAINTAINED IN BENT CONDITION

BACKGROUND OF THE INVENTION

This invention relates generally to the connection of circuit elements, as for example light units, to panel or circuit boards, and more particularly concerns the provision of means to retain circuit element terminals in bent condition for connection to panels or circuit boards.

In my prior U.S. Pat. No. 4,195,330 apparatus is disclosed for quickly mounting a light unit, such as a LED for example, to a panel, with unusual advantages. There is presently a need for mounting circuit components to circuit boards in different ways or positions. U.S. Pat. No. 4,837,927 discloses one way to achieve mounting of circuit component terminals to circuit boards with terminals extending perpendicular or parallel to board surfaces; however, there remains need to achieve such multiple mode mounting with terminals of different groupings held in locked and bent condition as described herein, to obviate problems of spring-back that occur upon terminal bending.

SUMMARY OF THE INVENTION

It is a major object of the invention to provide method and means to meet the above need, in an efficient, simple and reliable way.

In its apparatus aspects, the invention is directed to mounting of an assembly including a circuit element having a base and bent terminal means projecting downwardly from the base The mounting structure for the light unit includes:

a) a body defining a forwardly extending structure for telescopically interfitting the base of the element for retention thereto, b) the body having a laterally extending rear wall defining through opening means for passing the rearwardly projecting terminal means, c) and terminal retention means integral with the body and extending rearwardly of the rear wall for retaining the terminal means in bent condition, rearwardly of the rear wall.

As will be seen, the terminal retention means may advantageously include flange means projecting rearwardly of the body and defining J-slot means into which the terminal means is bent and retained against rearward withdrawal. In this regard, the J-slot means typically includes two J-slots, and the terminal means may include two elongated terminals respectively retained in said two J-slots, in bent condition of the two terminals. Cam surfaces may be provided to displace the elongated terminals transversely away from said J-slots just prior to resilient spring-back of the terminals into the J-slots, to be held therein by such spring-back forces.

It is another object of the invention to provide two such flanges for defining a pocket that has a rearward opening and that also extends in a direction normal to the rearward direction, and wherein said terminal means includes a third elongated terminal received via a rearward opening in the rear wall into the pocket as said third terminal is bent, the third terminal extending through the pocket generally normal to said rearward direction. Five through openings may be provided to accommodate two different terminal groupings, as will appear.

A further object is to provide terminal means that has first bent portions that extend normal to said rearward direction as aforesaid, and second bent portions that extend generally rearwardly from such first bent portions. Forming structure may be provided to be carried by the body rearwardly of the rear wall for engaging and limiting bending of the second bent portions of the terminal means. Such forming structure typically has a terminal bend limiting surface or surfaces that extend at an angle relative to said rearward direction to limit overbending of terminal second portions through an angle passing through said rearward direction, so that upon release of the terminal second portions, after such overbending, the terminal second portions will relax and return to positions extending rearwardly.

The terminal retention means typically includes flange means projecting rearwardly of the body and defining J-slot means into which the terminal means is bent and retained against rearward withdrawal, the bend limiting surface or surfaces projecting generally rearwardly of the J-slot means, on the flange means.

The body annular portion may have a counterbore for retention of the light unit, the light unit retained in that counterbore by the bent terminal means adjacent a surface of the body; and the body and light unit are typically held in telescoping interfit relation by the bent terminal means lockingly retained by J- slot structure. Further, multiple such bodies, in block form, may have interfitting interlocking means holding the bodies in stacked relation, as will appear.

The method of mounting the circuit component includes bending the terminal means rearwardly of the body rear wall, so as to extend generally normal to the circuit board, and locking the terminal means to the body, in bent condition, to prevent spring-back, whereby precise alignment of the bent terminal means with circuit board openings, and precise positioning of the circuit component on the board, can be achieved.

These and other objects and advantages of the invention, as well as the details of an illustrative embodiment, will be more fully understood from the following specification and drawings, in which:

DRAWING DESCRIPTION

FIG. 5 is a view like FIG. 2, but including a circuit element, in the form of a light unit;

FIG. 6 is a top plan view taken on lines 6—6 of FIG. 5;

FIG. 7 is an end view taken on lines 7—7 of FIG. 5;

FIG. 8 is an end view taken on lines 8—8 of FIG. 6;

FIG. 9 is a view like FIG. 5, but showing a second mode of controlled terminal bending;

FIG. 10 is a view like FIG. 9 but showing bent terminal relaxation;

FIG. 11 is a top plan view taken on lines 11—11 of FIG. 10;

FIG. 12 is a view like FIG. 10, showing provision for a modified bent terminal captivation;

FIG. 13 is a plan view taken on lines 13—13 of FIG. 12;

FIG. 14 is an end view taken on lines 14—14 of FIG. 12;

FIG. 15 is an end view taken on lines 15—15 of FIG. 13;

DETAILED DESCRIPTION

Figure 1:
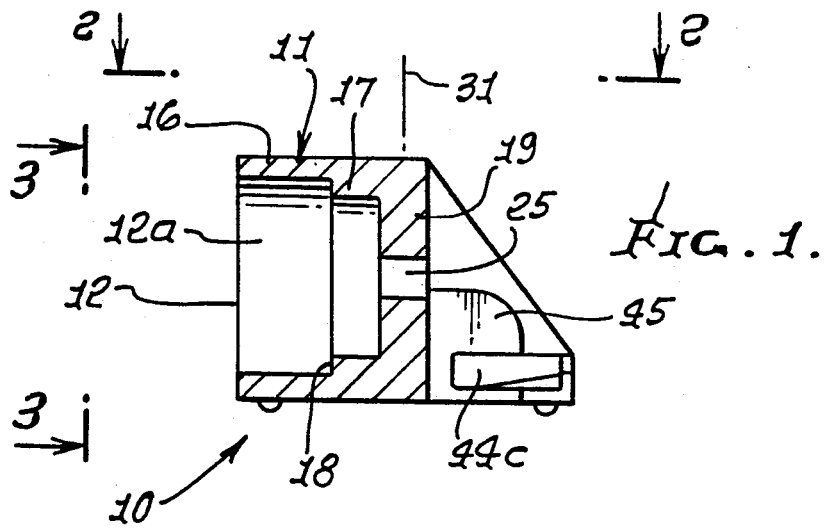
FIG. 1 is a side elevation, partly in section, showing a body that incorporates the invention, and is adapted to receive a circuit element, such as a light unit, for retaining the element terminals.
Figure 2:
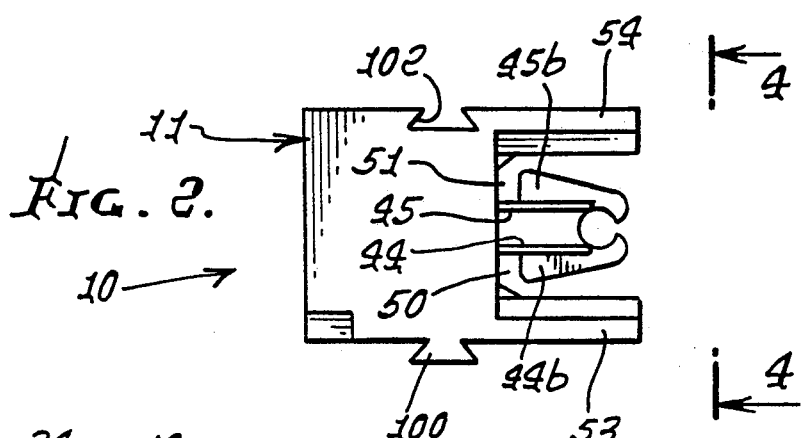
FIG. 2 is a top plan view taken on lines 2—2 of FIG. 1.
Figure 3:
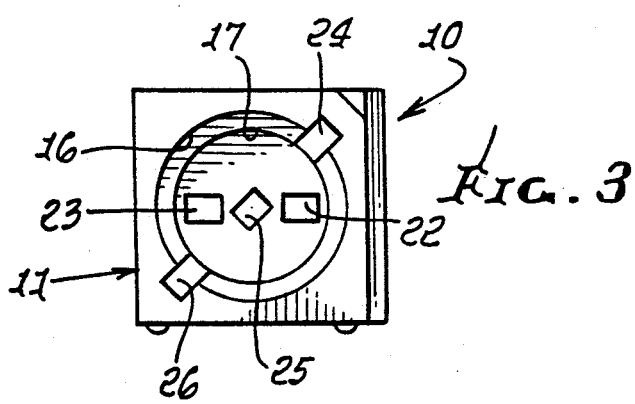
FIG. 3 is an end view taken on lines 3—3 of FIG. 1.

Referring first to FIGS. 1-8, a mount 10 includes a one-piece molded plastic body 11 having a recessed end 12 adapted to serve as a support for a circuit element or component, having terminal means. One example of a circuit element is a light unit such as LED 14. The body defines a longitudinally forwardly opening recess 12a to receive the base 15 of the circuit element, as seen in FIG. 5. Base 15 may be circular, for reception within a body cylindrical wall 16. A reduced diameter cylindrical wall 17 extends between lateral shoulder 18 and a laterally extending body rear wall 19.

Rear wall 19 defines through opening means to pass terminal means projecting rearwardly from the base 15 of the circuit element. Of advantage is the fact that the through opening means may accommodate different configurations or groupings of circuit element terminals, while also accommodating retention of such terminals, in bent condition rearwardly of wall 19, as will appear. Simple, effective bent terminal retention or captivating means is provided for these purposes.

Figure 4:
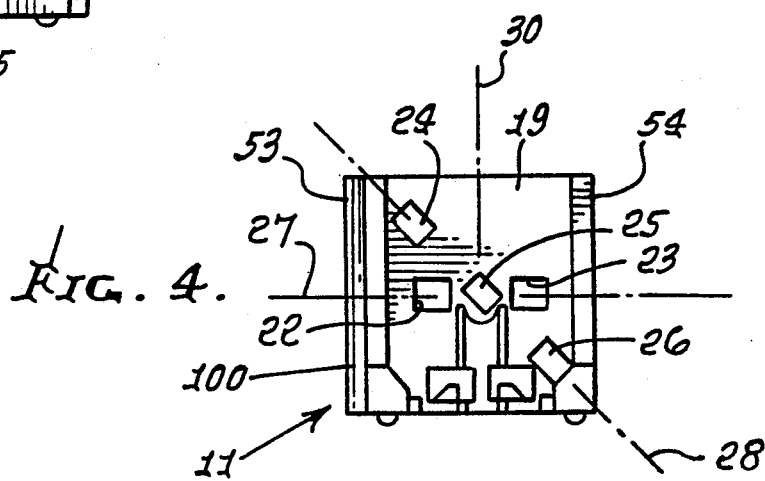
FIG. 4 is an end view taken on lines 4—4 of FIG. 2.

In this regard, note the two rectangular cross-section through openings 22 and 23 in FIG. 4, relatively located along a transverse line 27, circularly at 3 and 9 o'clock, for example; and also note the set of three rectangular cross-section through openings 24-26 in FIG. 4, rearwardly relatively located along a rotated transverse line 28, extending at 4:30 and 10:30 o'clock, circularly. Line 28 extends at 45 degrees relative to line 27. Opening 25 is at the intersection of a vertical longitudinal plane 30 with lines 27 and 28. All openings 22-26 extend in the same transverse plane 31 through wall 19, as seen in FIG. 1.

FIGS. 5, 6 and 8 show one configuration of terminal means that includes the two transversely spaced terminals 32 and 33 extending rearwardly at 32a and 33a from base 15, and through the transverse wall 19 via the respective openings 22 and 23. The terminals are bent downwardly at bends 32b and 33b, and then extend downwardly at 32c and 33c toward J-slots to be described. They then project downwardly at 32d and 33d to pass through openings 36 and 37 in a circuit board 38. Soldered circuit connections, or anchors for the terminals, appear at 40 and 41, at the underside of the board 38.

In accordance with an important aspect of the invention, retention means are provided, to be integral with body 11 and to extend rearwardly of wall 19, for receiving the terminal means, as for example terminals 32 and 33, in bent condition, rearwardly of wall 19. In the example, the terminal retention means take the form of flange means projecting rearwardly of the body and defining J-slot means into which the terminal means is or are bent and retained against rearward withdrawal and in precise positions of alignment with board openings 36 and 37. See for example the two parallel flanges 44 and 45 integral with wall 19 and projecting rearwardly in vertical planes 44a and 45a transversely spaced apart, and located between the openings 22 and 23. Such flanges have transverse enlargements 44b and 45b that form cam surfaces 44c and 45c, the latter acting to yieldably displace the elongated terminal portions 32c and 33c transversely away from the J-slots 50 and 51 just prior to resilient spring-back of the terminal portions 32c and 33c into the J-slots, as such terminals are bent downward. See the cam guided travel directions of the terminal portions 32c and 33c as indicated by arrows 48 and 49 in FIG. 6. Accordingly, the flange enlargements serve multiple functions, i.e. to form the J-slots between the forward ends of the enlargements and the wall 19, and also to form the terminal deflecting cam surfaces that extend forwardly and transversely oppositely, and terminate at the J-slots.

Note further that an additional pair of flanges 53 and 54 extend in parallel relation rearwardly from wall 19, and are transversely spaced laterally of the cam surfaces to define therewith guide channels 48a and 49a that taper forwardly, to guide the terminal portions 32c and 33c toward the narrowed entrances to the J-slots, as shown. Flanges 53 and 54 also serve the function of protectively housing the flanges 44 and 45 in the space between the flanges 53 and 54. Note further that flanges 44 and 45 may have greatly reduced width to provide flexures at the J-slots, to enable them to resiliently flex laterally toward one another as the terminals 32c and 33c are pressed into the channels in the direction of arrows 48 and 49, to ride against cam shoulders 44c and 45c, and snap into the J-slots, the flanges 44 and 45 then springing back (away from one another) into the positions seen in FIG. 6.

A further aspect of the mounting is the provision for the same flanges 44 and 45 to alternately retain or captivate bent portions of another grouping of three terminals, as for example terminals 60, 61 and 62 associated with the wall openings 24-26 as previously discussed. Accordingly, even further functions of the flanges 44 and 45 are provided, enabling a highly compact, efficient apparatus that serves multiple purposes in accommodating to different terminal group arrangements. Extending the description to FIGS. 12-15, note the three terminals 60-62 having rearwardly projecting portions 60a, 61a and 62a that extend through the respective openings 24-26 in wall 19. Those terminals also define downward bends at corners 60b-62b, and downwardly extending terminal portions at 60c-62c. Lower extents 60d-62d of the terminals project through openings 63-65 in circuit board 66, to be anchored, or otherwise connected to circuitry, solder extents 67-69.

Referring to FIG. 13, the J-slots 50 and 51 captivate the terminal downward extents 60c-62c, with flanges 44 and 45, cam surfaces 44c and 45c, and auxiliary flanges 53 and 54 functioning as described above. In addition, the two flanges 44 and 45 serve a yet additional function in providing a vertical pocket 70 between rearwardmost extents 44e and 45e of the flanges. Pocket 70 has a rearward opening 71, narrowed at 71a, that also extends in a downward direction normal to the longitudinal forward and rearward direction of axis 73. Pocket 70 is adapted to receive the terminal 61 downward extent 61c as the latter is bent downwardly to the condition as seen in FIGS. 12 and 13. The jaws defined by the flanges 44 and 45 spread apart to allow the third terminal extent 61c to enter the pocket, via opening 71. Note also that the terminal extents 60c and 62c may be inclined or bent from vertical and toward the J-slots, as seen in FIG. 15. This accommodates the wider lateral spacing of 24 and 26 to narrower lateral spacing of 50 and 51. Lowermost terminal extents 60d–62d are vertically provided, for example, as seen in FIG. 15, to pass vertically through the circuit board.

FIGS. 5 and 12 show the lower side of the body 11 mounted to, or seated on, the upper side of the circuit board or boards, as via mounting tangs or feet 80 and 81, integral with the body 11. The body 11 is held in position to the board by the soldered anchoring of the lowermost extents of the terminals, to the board or boards. Circuit element axis 73 is parallel to the circuit board.

Referring now to FIGS. 9–11, they show that end extents 32d and 33d of the terminals 32 and 33 may alternatively be bent to extend rearwardly to provide second bent portions of the terminals, seating on the circuit board, or circuitry thereon, as at locations 90 and 91. To facilitate this construction, the flanges 44 and 45 may have forming structure thereon, such as shoulders 44h and 45h, at the undersides of the flange enlarged portions 44c and 45c. Shoulders 44h and 45h extend rearward and upward at angles α, from horizontal, to permit initial limited over-bending of the terminal portion 32d and 33d as seen in FIG. 9. Thereafter, upon manual (or other) release of the bent terminal portions 32d and 33d, they relax to assume horizontally extending positions as shown in FIG. 10 for flat seating, with the body 11, on the circuit board 38 (or circuitry thereon).

Figure 16:
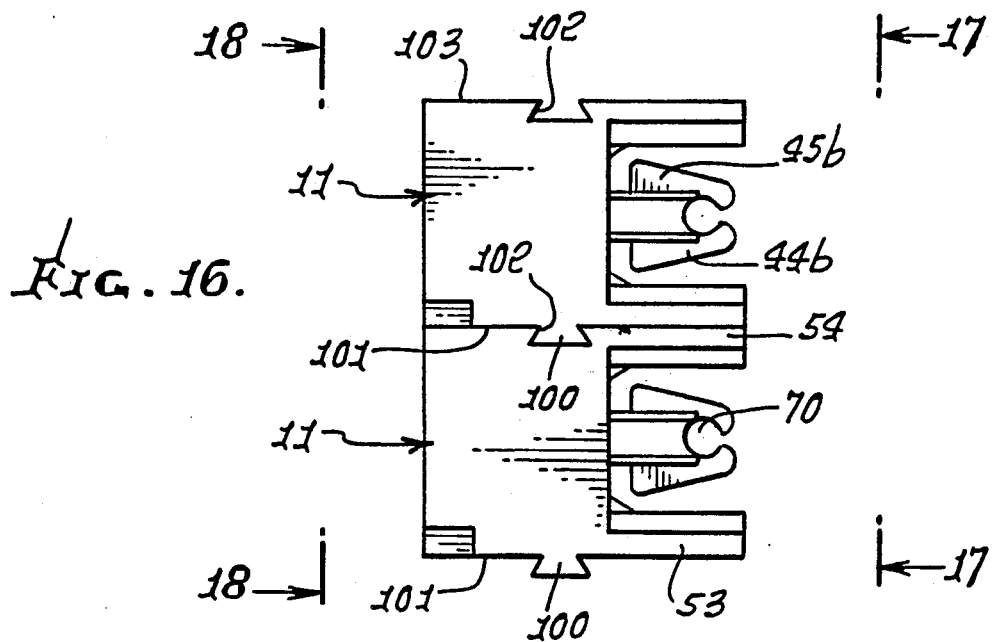
FIG. 16 is a top plan view showing cluster connection of multiple bodies, of the type seen in FIGS. 1-4.
Figure 17:
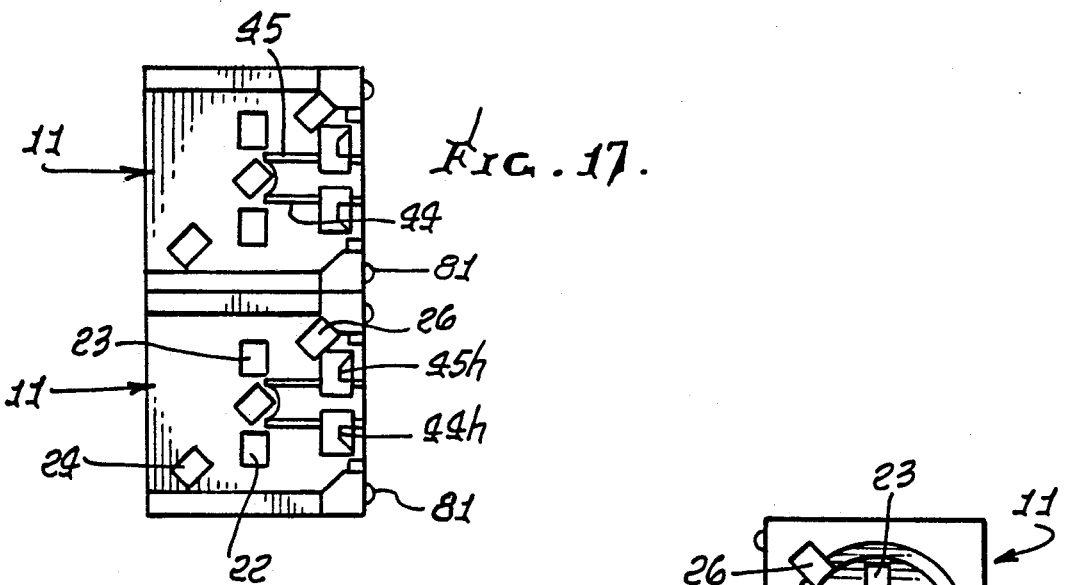
FIG. 17 is an end view taken on lines 17—17 of FIG. 16.
Figure 18:
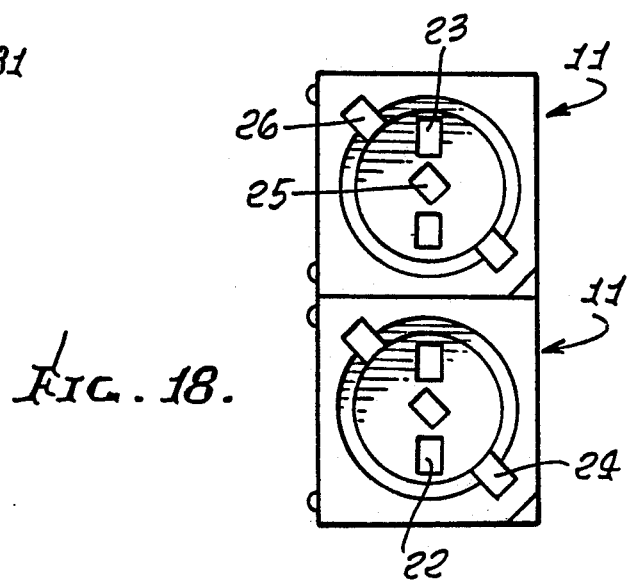
FIG. 18 is an end view taken on lines 18—18 of FIG. 16.

FIGS. 16–18 show the provision of locking means on the block-like bodies 11, to hold multiple such bodies in interlocking relation. See the trapezoidal construction lugs 100 projecting from sides 101 of the bodies, to interfit with trapezoidal cross-section notches 102 formed in body sides 103.

I claim:

1. For use in an assembly including a circuit element having a base and terminal means projecting rearwardly from the base, the combination with said element comprising
   a) a body defining a forwardly extending structure for telescopically interfitting the base of the element for retention thereto,
   b) the body having a laterally extending rear wall defining through opening means for passing said rearwardly projecting terminal means,
   c) and terminal retention means integral with the body and extending rearwardly of said rear wall for retaining said terminal means in bent condition, rearwardly of said rear wall,
   d) said terminal retention means including flange means projecting rearwardly of the body and defining J slot means into which said terminal means is bent and retained against rearward withdrawal,
   e) said J slots means including two J-slots, and said terminal means including two elongated terminals respectively retained in said two J-slots, in bent condition of the two terminals, there being cam surfaces which act to displace the elongated terminals transversely away from said J-slots just prior to resilient spring-back of the terminals into the J-slots.

2. The combination of claim 1 wherein two of said flanges define a pocket that has a rearward opening and that also extends in a direction normal to said rearward direction, and wherein said terminal means includes a third elongated terminal received via said rearward opening into said pocket, as the third terminal is bent, the third terminal extending through the pocket generally normal to said rearward direction.

3. The combination of claim 1 wherein said body annular portion has a counterbore for retention of the light unit, the light unit retained in that counterbore by the bent terminal means adjacent a surface of the body.

4. The combination of claim 1 wherein the bent terminal means is retained by the J slot means to in turn retain the body and element base in said telescoping interfit.

5. The combination of claim 1 including multiple of said bodies which are alike, the bodies having interfitting locking means to hold the bodies in stacked position.

6. The combination of claim 1 wherein said through opening means includes two openings, laterally spaced apart.

7. The combination of claim 1 including said terminal means which extends in rearward direction through said opening means and is bent to extend generally normal to said rearward direction, proximate to and rearwardly of said rear wall.

8. The combination of claim 7 wherein the terminal means has first bent portions that extend normal to said rearward direction as aforesaid, and second bent portions that extend generally rearwardly from said first bent portions.

9. For use in an assembly including a circuit element having a base and terminal means projecting rearwardly from the base, the combination with said element comprising
   a) a body defining a forwardly extending structure for telescopically interfitting the base of the element for retention thereto,
   b) the body having a laterally extending rear all defining through opening means for passing said rearwardly projecting terminal means,
   c) and terminal retention means integral with the body and extending rearwardly of said rear wall for retaining said terminal means in bent condition, rearwardly of said rear wall,
   d) and including said terminal means which extends in rearward direction through said opening means and is bent to extend generally normal to said rearward direction, proximate to and rearwardly of said rear wall,
   e) the terminal means having first bent portions that extend normal to said rearward direction as aforesaid, and second bent portions that extend generally rearwardly from said first bent portions,
   f) and including forming structure carried by the body rearwardly of said rear wall for engaging and limiting bending of said second bent portions of the terminal means.

10. The combination of claim 9 wherein said forming structure has a terminal bend limiting surface or surfaces that extend at an angle relative to said rearward direction to limit overbending of terminal second portions through an angle passing through said rearward direction so that upon release of the terminal second portions after such overbending the terminal second portions will relax and return to positions extending rearwardly.

11. The combination of claim 10 where said terminal retention means including flange means projecting rearwardly of the body and defining J slot means into which said terminal means is bent and retained against rearward withdrawal, said bend limiting surface or surfaces projecting generally rearwardly of said J-slot means, on said flange means.

12. The combination of claim 1 wherein said circuit-element is a light unit.

13. The combination of claim 12 wherein said light unit is an LED.

14. The combination of claim 1 wherein the flanges have flexures to enable flexing of the flanges as the terminals ride along the cam surfaces toward the J-slots.

15. The combination of claim 14 including two auxiliary flanges forming with said cam surfaces guide channels that taper forwardly toward the J-slots, for guiding the terminals toward the J-slots as the terminals travel along the cam surfaces, said auxiliary flanges also protectively housing said first mentioned flanges therebetween.

16. The combination of claim 1 wherein said through opening means includes three openings spaced apart along a diagonal relative to said terminal retention means.

17. The combination of claim 16 wherein said through opening means includes three additional openings spaced apart along a diagonal relative to said terminal retention means.

* * * * *